(12) United States Patent
Hui (10) Patent No.: US 11,823,484 B2
(45) Date of Patent: Nov. 21, 2023

(54) DISPLAY DEVICE AND FINGERPRINT IDENTIFICATION METHOD THEREOF

(71) Applicant: WUHAN CHINA STAR OPTOELECTRONICS TECHNOLOGY CO., LTD., Wuhan (CN)

(72) Inventor: Zhicheng Hui, Wuhan (CN)

(*) Notice: Subject to any disclaimer, the term of this patent is extended or adjusted under 35 U.S.C. 154(b) by 430 days.

(21) Appl. No.: 16/972,641

(22) PCT Filed: Oct. 30, 2020

(86) PCT No.: PCT/CN2020/125036
§ 371 (c)(1),
(2) Date: Dec. 7, 2020

(87) PCT Pub. No.: WO2022/073265
PCT Pub. Date: Apr. 14, 2022

(65) Prior Publication Data
US 2022/0319224 A1    Oct. 6, 2022

(30) Foreign Application Priority Data
Oct. 9, 2020 (CN) .......................... 202011072484.2

(51) Int. Cl.
*G06V 40/13* (2022.01)
*G06V 10/141* (2022.01)
(Continued)

(52) U.S. Cl.
CPC ....... *G06V 40/1318* (2022.01); *G02B 6/0051* (2013.01); *G02B 6/0053* (2013.01); *G02B 6/0055* (2013.01); *G06F 3/0416* (2013.01); *G06V 10/141* (2022.01); *H01L 25/167* (2013.01); *H01L 27/14643* (2013.01)

(58) Field of Classification Search
CPC ............ G06V 40/1318; G06V 10/141; G06V 40/1324; G02B 6/0051; G02B 6/0053; G02B 6/0055; G06F 3/0416; H01L 25/167; H01L 27/14643
See application file for complete search history.

(56) References Cited

U.S. PATENT DOCUMENTS

2017/0372114 A1* 12/2017 Cho ................... G06V 40/1318
2019/0196589 A1* 6/2019 Shim ................... H04M 1/0266
(Continued)

FOREIGN PATENT DOCUMENTS

| CN | 106203408 A | 12/2016 |
| CN | 109508590 A | 3/2019 |

(Continued)

OTHER PUBLICATIONS

Chinese Office Action issued in corresponding Chinese Patent Application No. 202011072484.2 dated Apr. 15, 2023, pp. 1-6.

*Primary Examiner* — Premal R Patel (57) ABSTRACT

A display device and a fingerprint identification method thereof are disclosed. The display device includes a backlight module, a display panel disposed on the backlight module, and a cover plate disposed on the display panel. Wherein, a transparent optical sensor layer is disposed between the backlight module and the display panel, and one side of the cover plate facing the display panel is provided with a first light source.

13 Claims, 4 Drawing Sheets

(51) Int. Cl.
*F21V 8/00* (2006.01)
*G06F 3/041* (2006.01)
*H01L 25/16* (2023.01)
*H01L 27/146* (2006.01)

(56) References Cited

U.S. PATENT DOCUMENTS

| | | | | |
|---|---|---|---|---|
| 2020/0026371 A1* | 1/2020 | Baek | ................... | H04W 12/68 |
| 2020/0183211 A1* | 6/2020 | Weng | ................ | G02F 1/133605 |
| 2020/0279877 A1* | 9/2020 | Kim | .................... | H01L 27/1464 |
| 2020/0349334 A1* | 11/2020 | Li | ..................... | G02F 1/133512 |
| 2021/0124199 A1* | 4/2021 | Qing | ................ | G02F 1/133317 |
| 2021/0294152 A1* | 9/2021 | Yu | ..................... | G02F 1/133357 |

FOREIGN PATENT DOCUMENTS

| | | |
|---|---|---|
| CN | 208654763 U | 3/2019 |
| CN | 109891432 A | 6/2019 |
| CN | 110062932 A | 7/2019 |
| CN | 110135405 A | 8/2019 |
| CN | 209543393 U | 10/2019 |
| CN | 210155688 U | 3/2020 |
| JP | 2014026352 A | 2/2014 |

* cited by examiner

```
┌─────────────────────────────────────────────────┐
│ Providing a display device including a control  │
│ module, a backlight module, a display panel     │
│ disposed on the backlight module, a touch       │
│ plate disposed on the display panel, and a      │
│ cover plate disposed on the touch plate,        │──S601
│ wherein, a transparent optical sensor layer is  │
│ disposed between the backlight module and the   │
│ display panel, and one side of the cover plate  │
│ facing the display panel is provided with a     │
│ first light source.                             │
└─────────────────────────────────────────────────┘
                         ⇩
┌─────────────────────────────────────────────────┐
│ If the touch plate detects the display device   │
│ is touched, the touch plate sends a touch       │──S602
│ signal to notify the control module to perform  │
│ a touch command identification.                 │
└─────────────────────────────────────────────────┘
                         ⇩
┌─────────────────────────────────────────────────┐
│ If performing a fingerprint image recognition   │
│ is required for a judged result of the touch    │──S603
│ command identification, the control module      │
│ controls the first light source to emit         │
│ emission light.                                 │
└─────────────────────────────────────────────────┘
                         ⇩
┌─────────────────────────────────────────────────┐
│ The transparent optical sensor layer receives   │
│ reflected light of the emission light reflected │
│ by a touch body and transmits a sensing signal  │──S604
│ to the control module to perform the            │
│ fingerprint image recognition.                  │
└─────────────────────────────────────────────────┘
                         ⇩
┌─────────────────────────────────────────────────┐
│ The control module controls the first light     │
│ source to be turned off after finishing the     │──S605
│ fingerprint image recognition.                  │
└─────────────────────────────────────────────────┘
```

DISPLAY DEVICE AND FINGERPRINT IDENTIFICATION METHOD THEREOF

FIELD OF INVENTION

The present disclosure relates to the field of display technologies, and more particularly, to a display device and a fingerprint identification method thereof.

BACKGROUND OF INVENTION

Liquid crystal display panels, as current most widely used display screens, have advantages of low prices and comprehensive performance. However, since they cannot emit light by themselves, backlight modules are required for providing backlight. Since the backlight modules have poor imaging and backlight sources cannot meet requirements of light for fingerprint identification, if fingerprint identification modules are disposed under the backlight modules and light sources of the backlight modules are used for providing fingerprint identification light sources, under-screen fingerprint identification cannot be realized, and user experiences are poorer. Therefore, it is necessary to resolve this defect.

Technical problem: the present disclosure provides a display device and a fingerprint identification method to solve the technical problem in current display devices of inability to realize the under-screen fingerprint identification.

SUMMARY OF INVENTION

An embodiment of the present disclosure provides a display device, which includes a backlight module, a display panel disposed on the backlight module, and a cover plate disposed on the display panel. Wherein, a transparent optical sensor layer is disposed between the backlight module and the display panel. One side of the cover plate facing the display panel is provided with a first light source.

In the display device provided in an embodiment of the present disclosure, the first light source and the display panel are disposed on a same layer.

In the display device provided in an embodiment of the present disclosure, the first light source is a light-emitting diode.

In the display device provided in an embodiment of the present disclosure, the transparent optical sensor layer is composed of a plurality of complementary metal oxide semiconductor sensors.

In the display device provided in an embodiment of the present disclosure, each of the complementary metal oxide semiconductor sensors includes an image acquisition unit and a signal processing unit.

In the display device provided in an embodiment of the present disclosure, an insulating layer is disposed between the transparent optical sensor layer and the backlight module.

In the display device provided in an embodiment of the present disclosure, an optical adhesive layer is disposed between the transparent optical sensor layer and the display panel.

In the display device provided in an embodiment of the present disclosure, the backlight module includes a reflective sheet, a light guide plate disposed on the reflective sheet, a second light source disposed on one side of the light guide plate, and an optical film set disposed on the light guide plate.

In the display device provided in an embodiment of the present disclosure, the optical film set includes a diffusion sheet, a prism sheet, and a reflective polarizing brightness enhancing film.

In the display device provided in an embodiment of the present disclosure, the backlight module includes the reflective sheet, a third light source disposed on the reflective sheet, a diffusion plate disposed on the third light source, and the optical film set disposed on the diffusion plate.

In the display device provided in an embodiment of the present disclosure, the optical film set includes the diffusion sheet, the prism sheet, and the reflective polarizing brightness enhancing film.

An embodiment of the present disclosure further provides a fingerprint identification method of a display device, comprising following steps: providing a display device including a control module, a backlight module, a display panel disposed on the backlight module, a touch plate disposed on the display panel, and a cover plate disposed on the touch plate, wherein a transparent optical sensor layer is disposed between the backlight module and the display panel, and one side of the cover plate facing the display panel is provided with a first light source; if the touch plate detects the display device is touched, the touch plate sends a touch signal to notify the control module to perform a touch command identification; if performing a fingerprint image recognition is required for a judged result of the touch command identification, the control module controls the first light source to emit emission light; the transparent optical sensor layer receives reflected light of the emission light reflected by a touch body and transmits a sensing signal to the control module to perform the fingerprint image recognition; and the control module controls the first light source to be turned off after finishing the fingerprint image recognition.

In the fingerprint identification method of the display device provided in an embodiment of the present disclosure, the first light source and the display panel are disposed on a same layer.

In the fingerprint identification method of the display device provided in an embodiment of the present disclosure, the first light source is a light-emitting diode.

In the fingerprint identification method of the display device provided in an embodiment of the present disclosure, the transparent optical sensor layer is composed of a plurality of complementary metal oxide semiconductor sensors.

In the fingerprint identification method of the display device provided in an embodiment of the present disclosure, each of the complementary metal oxide semiconductor sensors includes an image acquisition unit and a signal processing unit.

In the fingerprint identification method of the display device provided in an embodiment of the present disclosure, an insulating layer is disposed between the transparent optical sensor layer and the backlight module.

In the fingerprint identification method of the display device provided in an embodiment of the present disclosure, an optical adhesive layer is disposed between the transparent optical sensor layer and the display panel.

In the fingerprint identification method of the display device provided in an embodiment of the present disclosure, the backlight module includes a reflective sheet, a light guide plate disposed on the reflective sheet, a second light source disposed on one side of the light guide plate, and an optical film set disposed on the light guide plate.

In the fingerprint identification method of the display device provided in an embodiment of the present disclosure, the backlight module includes the reflective sheet, a third light source disposed on the reflective sheet, a diffusion plate disposed on the third light source, and the optical film set disposed on the diffusion plate.

Beneficial effect: by disposing the transparent optical sensor layer between the backlight module and the display panel, and disposing the first light source under the cover plate in the display device provided by the present disclosure, the emission light of the first light source and the reflected light reflected by a finger are not consumed by the backlight module, and the transparent optical sensor layer can perform full-screen fingerprint identification rapidly and accurately without affecting a structure and brightness of the backlight module, which has simple processes.

DETAILED DESCRIPTION OF PREFERRED EMBODIMENTS

In order to make the purpose, technical solutions, and effects of the present disclosure clearer and more definite, the following further describes the present disclosure in detail with reference to the drawings and embodiments. In the drawings, for clarity and ease of understanding and description, the sizes and thicknesses of the components shown in the drawings are not to scale.

Figure 1:
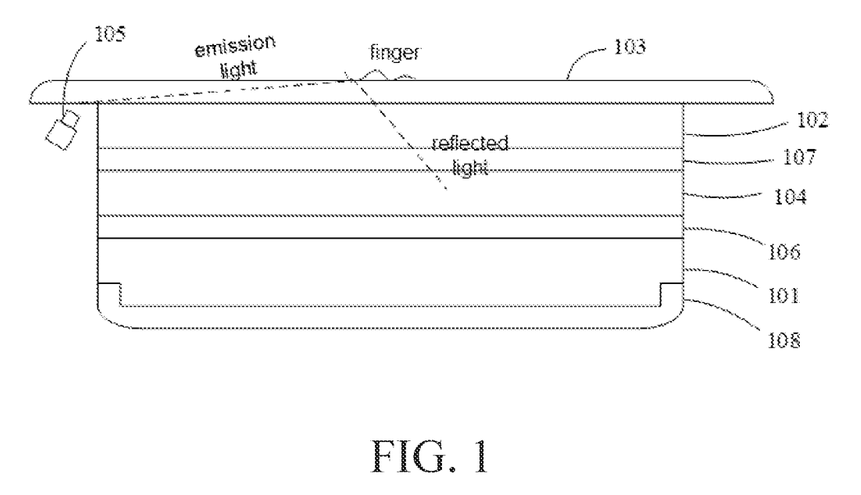
FIG. 1 is a schematic basic structural diagram of a display device according to an embodiment of the present disclosure.

As shown in FIG. 1, FIG. 1 is a schematic basic structural diagram of a display device according to an embodiment of the present disclosure. The display device includes a backlight module 101, a display panel 102 disposed on the backlight module 101, and a cover plate 103 disposed on the display panel 102. Wherein, a transparent optical sensor layer 104 is disposed between the backlight module 101 and the display panel 102, and one side of the cover plate 103 facing the display panel 102 is provided with a first light source 105.

It should be noted that the first light source 105 is configured to provide emission light for fingerprint identification. When a user touches the display device with a finger, the emission light emitted from the first light source 105 immediately irradiates whole cover plate area, and is reflected by the finger to form reflected light, and the reflected light is transmitted to the transparent optical sensor layer 104 to form a fingerprint image, thereby realizing full-screen fingerprint identification. By disposing the transparent optical sensor layer 104 between the backlight module 101 and the display panel 102, and disposing the first light source 105 under the cover plate 103 in this embodiment of the present disclosure, the emission light of the first light source 105 and the reflected light reflected by the finger are not consumed by the backlight module 101, and the transparent optical sensor layer 104 can perform the full-screen fingerprint identification rapidly and accurately without affecting a structure and brightness of the backlight module 101, which has simple processes.

Specifically, when the finger presses a surface of the cover plate 103, ridge lines on the finger are in contact with the surface of the cover plate 103, and valley lines are not in contact with the surface of the cover plate 103. Therefore, light irradiated on the surface of the cover plate 103 where the ridge lines of a fingerprint are in contact with is diffusely reflected, while light irradiated on the surface of the cover plate 103 corresponding to the valley lines of the fingerprint is totally reflected, so in the fingerprint image collected by the transparent optical sensor layer 104, a part corresponding to the ridge lines of the fingerprint has darker color, and another part corresponding to the valley lines of the fingerprint has lighter color.

In an embodiment of the present disclosure, the first light source 105 and the display panel 102 are disposed on a same layer. As shown in FIG. 1, the first light source 105 is disposed on a left side of the display panel 102, while the backlight module 101 is disposed on a lower side of the display panel 102, so the first light source 105 is closer to the cover plate 103. When the fingerprint identification is performed, the emission light emitted from the first light source 105 can be rapidly shed on the surface of the cover plate 103, and the full-screen fingerprint identification can be realized by cooperation of the transparent optical sensor layer 104 disposed between the display panel 102 and the backlight module 101. This solves poor light transmittance of the backlight module and a technical problem of inability to perform the fingerprint identification caused by backlight sources unable to meet a light requirement for the fingerprint identification, and meanwhile, it is not necessary to change structures of the backlight module and the display panel, and manufacturing processes are simpler.

In an embodiment of the present disclosure, the first light source 105 is a light-emitting diode. The light-emitting diode has high luminous efficiency and low cost, and it can be fixed onto a plastic frame of the display device when being used. In other embodiments, the first light source 105 is disposed in a tilt way, and a tilt angle has a predetermined included angle with a horizontal direction. A specific situation is determined by if a luminous distance and a luminous range meet to irradiate on whole cover plate area, and the present disclosure is not limited to this.

In an embodiment of the present disclosure, the transparent optical sensor layer 104 is composed of a plurality of complementary metal oxide semiconductor sensors. The complementary metal oxide semiconductor sensors use photosensitive diodes to perform photoelectric conversion, and convert collected images (electrical signals, that is, analog signals) into digital signals for output.

In an embodiment of the present disclosure, an insulating layer 106 is disposed between the transparent optical sensor layer 104 and the backlight module 101. Specifically, a material of the insulating layer 106 is polyethylene terephthalate, which has excellent electrical insulation and high transparency, and can block ultraviolet light.

In an embodiment of the present disclosure, an optical adhesive layer 107 is disposed between the transparent optical sensor layer 104 and the display panel 102. That is, the display panel 102 is connected to the transparent optical sensor layer 104 by the optical adhesive layer 107. Specifically, the optical adhesive layer 107 can be formed on a bottom of the display panel 102 first, then an upper surface of the transparent optical sensor layer 104 is attached to another side of the optical adhesive layer 107, and then curing is performed. Or the optical adhesive layer 107 is formed on the upper surface of the transparent optical sensor layer 104 first, then the bottom of the display panel 102 is attached to an upper surface of the optical adhesive layer 107, and finally, curing is performed.

In an embodiment of the present disclosure, the display device further includes a back frame 108, and the backlight module 101 is disposed on the back frame 108. Wherein, the back frame 108 may be an iron frame or a plastic-iron composite frame.

Figure 2:
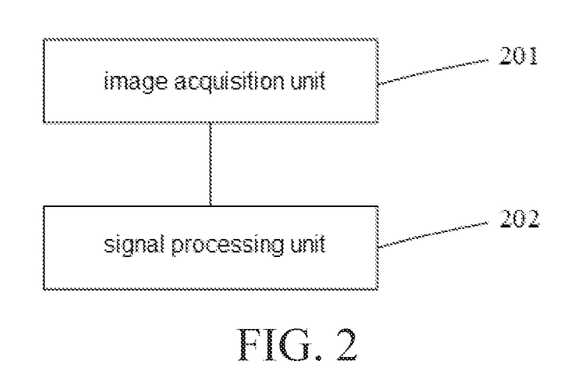
FIG. 2 is a functional block diagram of a complementary metal oxide semiconductor sensor according to an embodiment of the present disclosure.

As shown in FIG. 2, FIG. 2 is a functional block diagram of a complementary metal oxide semiconductor sensor according to an embodiment of the present disclosure. Each of the complementary metal oxide semiconductor sensors includes an image acquisition unit 201 and a signal processing unit 202. Wherein, the image acquisition unit 201 is configured to collect users' fingerprint images and convert optical signals into electrical signals. The signal processing unit 202 is configured to deal with the fingerprint images collected by the image acquisition unit 201, convert the electrical signals into digital signals, and then amplify for output.

Figure 3:
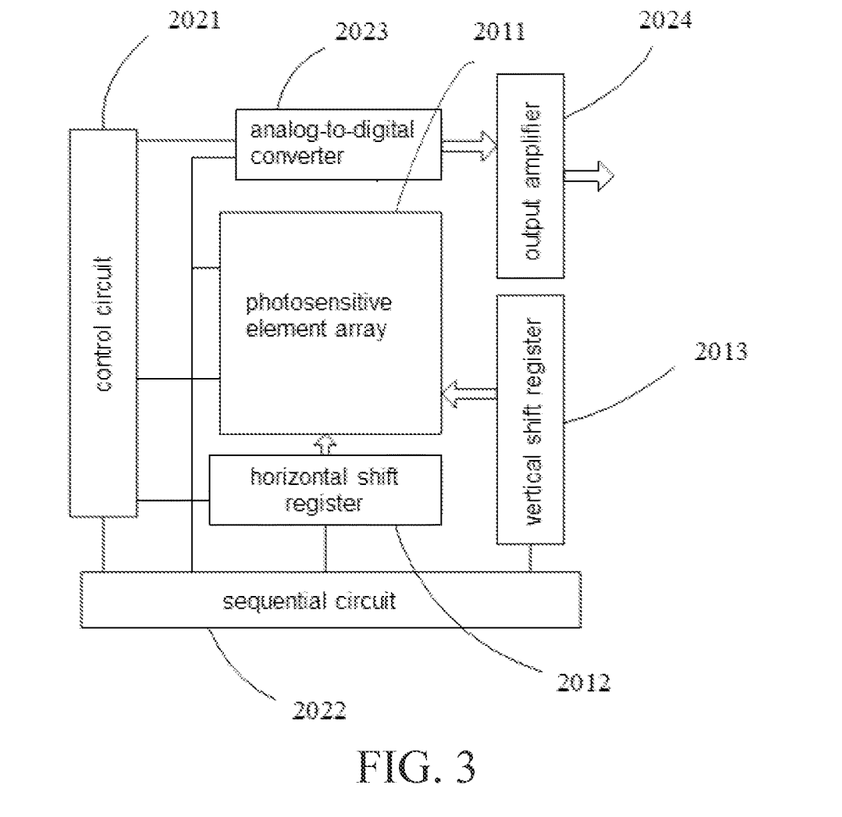
FIG. 3 is a structural block diagram of the complementary metal oxide semiconductor sensor according to an embodiment of the present disclosure.

As shown in FIG. 3, FIG. 3 is a structural block diagram of the complementary metal oxide semiconductor sensor according to an embodiment of the present disclosure. The complementary metal oxide semiconductor sensor is composed of a photosensitive element array 2011, a horizontal shift register 2012, a vertical shift register 2013, a control circuit 2021, a sequential circuit 2022, an analog-to-digital converter 2023, and an output amplifier 2024, and these parts are usually integrated into a same silicon chip. A working process can generally be divided into reset, photoelectric conversion, integration, and readout.

In an embodiment of the present disclosure, when the emission light emitted from the first light source 105 (as shown in FIG. 1) is reflected by the finger to form the reflected light, the reflected light is transmitted to the transparent optical sensor layer 104 (as shown in FIG. 1). Wherein, the photosensitive element array 2011 receives the reflected light. The photosensitive element array 2011 is a two-dimensional pixel array, and each pixel unit is composed of a photosensitive diode and a metal oxide semiconductor (MOS) transistor which functions as a switch. The photosensitive diode in each pixel unit converts light intensity on an array surface thereof into the electrical signals, and the control circuit 2021 controls the horizontal shift register 2012 and the vertical shift register 2013 to select one pixel unit, reads out an electrical signal of the pixel unit, and transmits the electrical signal to the analog-to-digital converter 2023 for converting the electrical signal into a digital image signal, and the digital image signal is output after amplified by the output amplifier 2024.

It should be noted that the horizontal shift register 2012 turns on MOS transistors from left to right in sequence for horizontal scanning, that is, column addressing, and the vertical shift register 2013 addresses each row of the array. That is, horizontal switches are turned on sequentially under a pulse effect generated by the horizontal shift register 2012, and vertical switches are turned on under another pulse effect generated by the vertical shift register 2013, thereby applying a reference voltage (bias voltage) to the photosensitive diode of each pixel unit in sequence.

Wherein, the diodes receiving the reflected light generate carriers to discharge junction capacitors. This is a process of signal accumulation during an integration period, and a process of turning on the bias voltage is also a process of signal reading.

It should be noted that a magnitude of a formed electrical signal is proportional to an intensity of the received light on the pixel unit. That is, if the light is stronger, the greater the electrical signal is, while if the light is weaker, the smaller the electrical signal is.

In an embodiment of the present disclosure, the vertical shift register 2013 may scan the photosensitive element array 2011 row-by-row or interlacedly.

In an embodiment of the present disclosure, other digital signal processing circuits may also be integrated onto the complementary metal oxide semiconductor sensors, such as automatic exposure control circuits, non-uniform compensation circuits, white balance processing circuits, black level control circuits, gamma correction circuits, etc.

Figure 4:
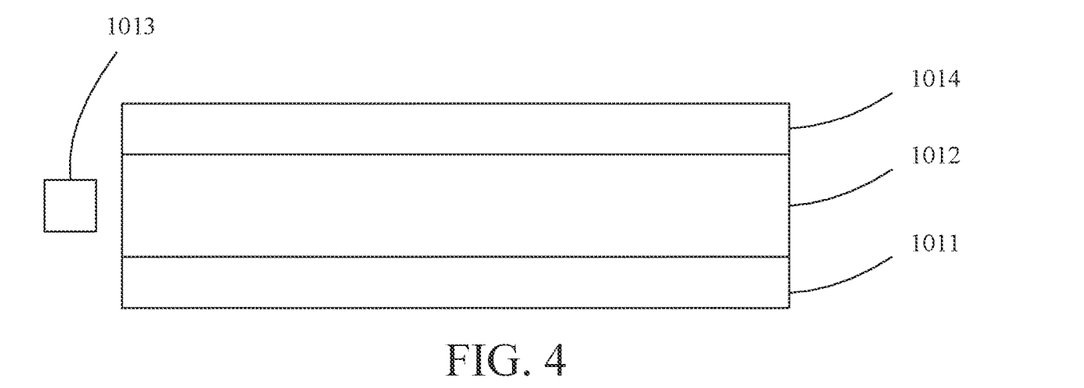
FIG. 4 is a schematic basic structural diagram of a backlight module according to an embodiment of the present disclosure.

As shown in FIG. 4, FIG. 4 is a schematic basic structural diagram of the backlight module according to an embodiment of the present disclosure. The backlight module includes a reflective sheet 1011, a light guide plate 1012 disposed on the reflective sheet 1011, a second light source 1013 disposed on one side of the light guide plate 1012, and an optical film set 1014 disposed on the light guide plate 1012.

Wherein, the optical film set 1014 includes a diffusion sheet (not shown in the figure), a prism sheet (not shown in the figure), and a reflective polarizing brightness enhancing film (not shown in the figure).

It should be noted that a main function of the reflective sheet 1011 is to reflect light leaking out from the light guide plate 1012 back, thereby improving utilization of light sources. A main function of the light guide plate 1012 is to guide light for directions, that is, converting horizontal incident light from the second light source 1013 into vertical emitting light. A main function of the diffusion sheet (not shown in the figure) is to further soften the vertical emitting light and increase upward brightness of the light, thereby allowing the vertical emitting light to be more uniform. A main function of the prism sheet (not shown in the figure) is to gather incident light from the diffusion sheet, thereby increasing brightness at front. A main function of the reflective polarizing brightness enhancing film (not shown in the figure) is to improve utilization of the backlight sources, that is, to improve aperture ratio of the display device.

Figure 5:
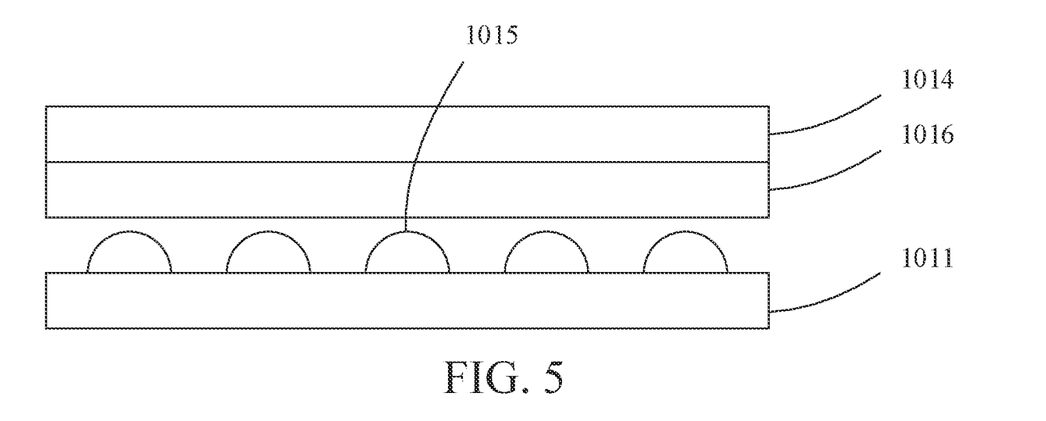
FIG. 5 is another schematic basic structural diagram of the backlight module according to an embodiment of the present disclosure.

As shown in FIG. 5, FIG. 5 is another schematic basic structural diagram of the backlight module according to an embodiment of the present disclosure. The backlight module includes the reflective sheet 1011, a third light source 1015 disposed on the reflective sheet 1011, a diffusion plate 1016 disposed on the third light source 1015, and the optical film set 1014 disposed on the diffusion plate 1016.

Wherein, the optical film set 1014 includes the diffusion sheet (not shown in the figure), the prism sheet (not shown in the figure), and the reflective polarizing brightness enhancing film (not shown in the figure).

It should be noted that a main function of the reflective sheet 1011 is to reflect light reflected from the diffusion plate 1016 back, thereby improving utilization of light sources. A main function of the diffusion plate 1016 is to soften and convert the third light source 1015 (point light source) into a surface light source, thereby preventing influences of lamp shadows and pillar shadows. A main function of the diffusion sheet (not shown in the figure) is to further soften the surface light source and increase upward brightness of the light, thereby allowing the surface light source to be more uniform. The main function of the prism sheet (not shown in the figure) is to gather the incident light from the diffusion sheet, thereby increasing the brightness at front. The main function of the reflective polarizing brightness enhancing film (not shown in the figure) is to improve the utilization of the backlight sources, that is, to improve the aperture ratio of the display device.

Figure 6:
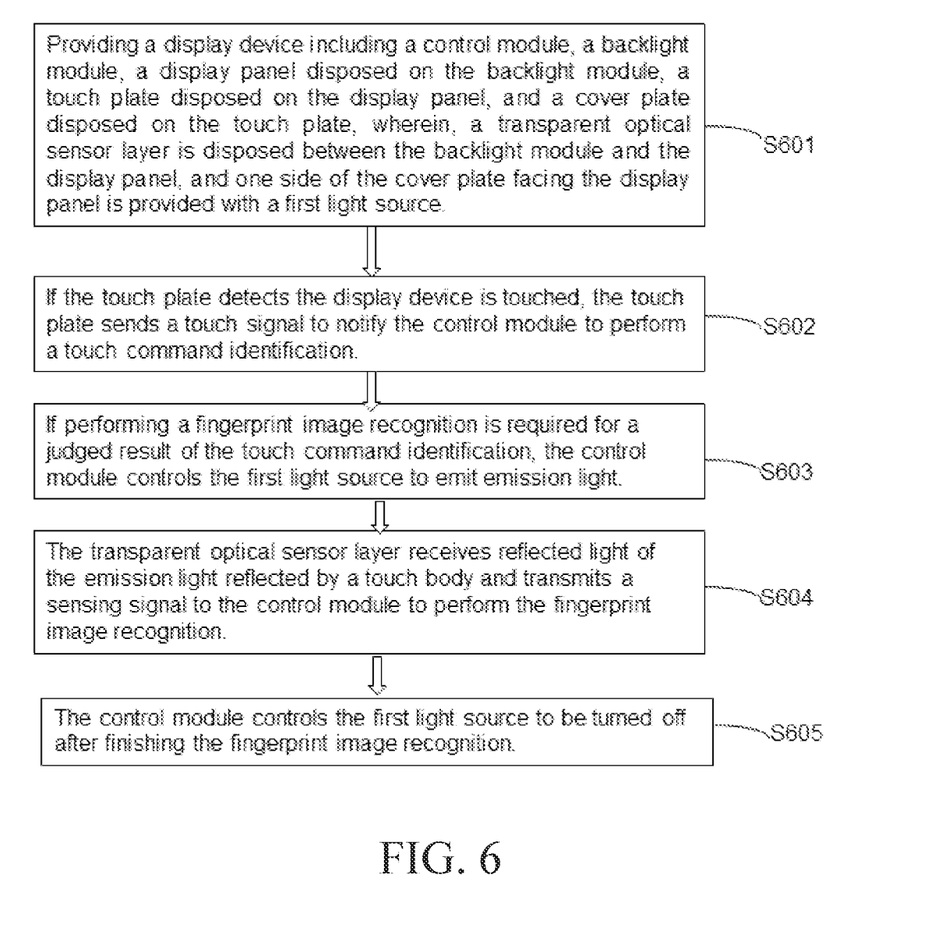
FIG. 6 is a flowchart of a fingerprint identification method of the display device according to an embodiment of the present disclosure.
Figure 7:
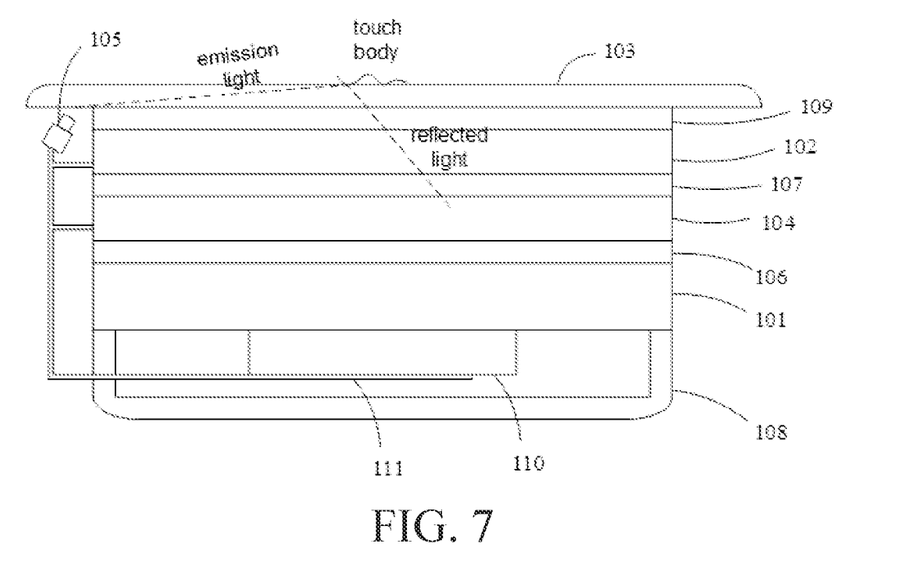
FIG. 7 is another schematic basic structural diagram of the display device according to an embodiment of the present disclosure.

As shown in FIGS. 6 and 7, FIG. 6 is a flowchart of a fingerprint identification method of the display device according to an embodiment of the present disclosure, and FIG. 7 is another schematic basic structural diagram of the display device according to an embodiment of the present disclosure. The fingerprint identification method of the display device provided by this embodiment of the present disclosure includes following steps:

S601: providing the display device including a control module 110, the backlight module 101, the display panel 102 disposed on the backlight module 101, a touch plate 109 disposed on the display panel 102, and the cover plate 103 disposed on the touch plate 109. Wherein, the transparent optical sensor layer 104 is disposed between the backlight module 101 and the display panel 102, and the one side of the cover plate 103 facing the display panel 102 is provided with the first light source 105;

S602: if the touch plate 109 detects the display device is touched, the touch plate 109 sends a touch signal to notify the control module 110 to perform a touch command identification;

S603: if performing a fingerprint image recognition is required for a judged result of the touch command identification, the control module 110 controls the first light source 105 to emit emission light;

S604: the transparent optical sensor layer 104 receives reflected light of the emission light reflected by a touch body and transmits a sensing signal to the control module 110 to perform the fingerprint image recognition; and S605: the control module 110 controls the first light source 105 to be turned off after finishing the fingerprint image recognition.

Wherein, the display device further includes a flexible circuit board 111. One end of the flexible circuit board is attached to one side of the control module 110 and electrically connected to the control module 110, and another end of the flexible circuit board is electrically connected to the first light source 105, the transparent optical sensor layer 104, and the display panel 102 respectively. The touch plate 109 is also electrically connected to the control module 110 (not shown in the figure). The control module 110 is attached to one side of the backlight module 101.

It should be noted that when the user touches the display device with the finger (that is, the touch body), the emission light emitted from the first light source 105 immediately irradiates whole cover plate area, and is reflected by the touch body to form the reflected light, and the reflected light is transmitted to the transparent optical sensor layer 104 to form the fingerprint image, thereby realizing the full-screen fingerprint identification. By disposing the transparent optical sensor layer 104 between the backlight module 101 and the display panel 102, and disposing the first light source 105 under the cover plate 103 in this embodiment of the present disclosure, the emission light of the first light source 105 and the reflected light reflected by the touch body are not consumed by the backlight module 101, thereby having clearer and stronger signals, and the transparent optical sensor layer 104 can perform the full-screen fingerprint identification rapidly and accurately without affecting a structure and brightness of the backlight module 101, which has simple processes.

In an embodiment of the present disclosure, the insulating layer 106 is disposed between the transparent optical sensor layer 104 and the backlight module 101. Specifically, the material of the insulating layer 106 is polyethylene terephthalate, which has excellent electrical insulation and high transparency, and can block the ultraviolet light.

In an embodiment of the present disclosure, the optical adhesive layer 107 is disposed between the transparent optical sensor layer 104 and the display panel 102. That is, the display panel 102 is connected to the transparent optical sensor layer 104 by the optical adhesive layer 107. Specifically, the optical adhesive layer 107 can be formed on the bottom of the display panel 102 first, then the upper surface of the transparent optical sensor layer 104 is attached to the another side of the optical adhesive layer 107, and then curing is performed. Or the optical adhesive layer 107 is formed on the upper surface of the transparent optical sensor layer 104 first, then the bottom of the display panel 102 is attached to the upper surface of the optical adhesive layer 107, and finally, curing is performed.

In an embodiment of the present disclosure, the display device further includes the back frame 108, and the control module 110 is disposed on the back frame 108. Wherein, the back frame 108 may be the iron frame or the plastic-iron composite frame.

In summary, by disposing the transparent optical sensor layer between the backlight module and the display panel, and disposing the first light source under the cover plate in the display device provided in this embodiment of the present disclosure, the emission light of the first light source and the reflected light reflected by the finger are not consumed by the backlight module, and the transparent optical sensor layer can perform the full-screen fingerprint identification rapidly and accurately without affecting the structure and brightness of the backlight module, which has simple processes. This solves a technical problem in current display devices of inability to realize the under-screen fingerprint identification.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A display device, comprising a backlight module, a display panel disposed on the backlight module, and a cover plate disposed on the display panel;
   wherein a transparent optical sensor layer is disposed between the backlight module and the display panel, and one side of the cover plate facing the display panel is provided with a first light source,
   wherein the backlight module comprises a reflective sheet, a second light source disposed on the reflective sheet, a diffusion plate disposed on the second light source, and an optical film set disposed on the diffusion plate,
   wherein the first light source and the display panel are disposed on a same layer, and the first light source is closer to the cover plate than the backlight module comprising the reflective sheet, the second light source, the diffusion plate and the optical film.

2. The display device according to claim 1, wherein the first light source is a light-emitting diode.

3. The display device according to claim 1, wherein the transparent optical sensor layer is composed of a plurality of complementary metal oxide semiconductor sensors.

4. The display device according to claim 3, wherein each of the complementary metal oxide semiconductor sensors comprises an image acquisition unit and a signal processing unit.

5. The display device according to claim 1, wherein an insulating layer is disposed between the transparent optical sensor layer and the backlight module.

6. The display device according to claim 1, wherein an optical adhesive layer is disposed between the transparent optical sensor layer and the display panel.

7. The display device according to claim 1, wherein the optical film set comprises a diffusion sheet, a prism sheet, and a reflective polarizing brightness enhancing film.

8. A fingerprint identification method of a display device, comprising following steps:
   providing the display device comprising a control module, a backlight module, a display panel disposed on the backlight module, a touch plate disposed on the display panel, and a cover plate disposed on the touch plate, wherein a transparent optical sensor layer is disposed between the backlight module and the display panel, and one side of the cover plate facing the display panel is provided with a first light source, wherein the backlight module comprises a reflective sheet, a second light source disposed on the reflective sheet, a diffusion plate disposed on the second light source, and an optical film set disposed on the diffusion plate, wherein the first light source and the display panel are disposed on a same layer, and the first light source is closer to the cover plate than the backlight module comprising the reflective sheet, the second light source, the diffusion plate and the optical film;
   if the touch plate detects the display device is touched, the touch plate sends a touch signal to notify the control module to perform a touch command identification;
   if performing a fingerprint image recognition is required for a judged result of the touch command identification, the control module controls the first light source to emit emission light;
   the transparent optical sensor layer receives reflected light of the emission light reflected by a touch body and transmits a sensing signal to the control module to perform the fingerprint image recognition; and
   the control module controls the first light source to be turned off after finishing the fingerprint image recognition.

9. The fingerprint identification method of the display device according to claim 8, wherein the first light source is a light-emitting diode.

10. The fingerprint identification method of the display device according to claim 8, wherein the transparent optical sensor layer is composed of a plurality of complementary metal oxide semiconductor sensors.

11. The fingerprint identification method of the display device according to claim 10, wherein each of the complementary metal oxide semiconductor sensors comprises an image acquisition unit and a signal processing unit.

12. The fingerprint identification method of the display device according to claim 8, wherein an insulating layer is disposed between the transparent optical sensor layer and the backlight module.

13. The fingerprint identification method of the display device according to claim 8, wherein an optical adhesive layer is disposed between the transparent optical sensor layer and the display panel.

\* \* \* \* \*